US012581950B2

(12) United States Patent
Koyama

(10) Patent No.: US 12,581,950 B2
(45) Date of Patent: Mar. 17, 2026

(54) SEMICONDUCTOR COOLING APPARATUS WITH UNIFORM FLOW DISTRIBUTION STRUCTURES

(71) Applicant: FUJI ELECTRIC CO., LTD., Kanagawa (JP)

(72) Inventor: Takahiro Koyama, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 331 days.

(21) Appl. No.: 17/827,996

(22) Filed: May 30, 2022

(65) Prior Publication Data

US 2022/0293491 A1 Sep. 15, 2022

Related U.S. Application Data

(63) Continuation of application No. 16/368,756, filed on Mar. 28, 2019, now Pat. No. 11,362,017.

(30) Foreign Application Priority Data

May 2, 2018 (JP) ................................. 2018-088899

(51) Int. Cl.
*H01L 23/473* (2006.01)
*F28F 3/02* (2006.01)
(Continued)

(52) U.S. Cl.
CPC ............ *H01L 23/473* (2013.01); *F28F 3/027* (2013.01); *F28F 9/028* (2013.01); *H05K 7/20854* (2013.01)

(58) Field of Classification Search
CPC ......... H01L 23/473; F28F 3/027; F28F 3/048; F28F 9/028; F28F 9/026; F28F 13/06;
(Continued)

(56) References Cited

U.S. PATENT DOCUMENTS 3,817,321 A 6/1974 Von Cube
5,058,391 A 10/1991 Periot
(Continued)

FOREIGN PATENT DOCUMENTS

JP S52136358 A 11/1977
JP H02162795 A 6/1990
(Continued)

OTHER PUBLICATIONS

Office Action issued for counterpart Japanese Application No. 2018-088899, issued by the Japanese Patent Office on Feb. 22, 2022 (drafted on Feb. 14, 2022).

(Continued)

*Primary Examiner* — Travis Ruby

(57) ABSTRACT

The flow speed distribution of a refrigerant in a cooling apparatus is made uniform. A cooling apparatus provided includes: a top plate; a casing portion having a base plate facing the top plate, and a refrigerant delivery portion arranged between the top plate and the base plate, the casing portion provided with two opening portions to function as an inlet port through which a refrigerant is let into the refrigerant delivery portion and an outlet port through which the refrigerant is let out; a cooling fin portion arranged in the refrigerant delivery portion of the casing portion and between the two opening portions; and a loss adding portion arranged in the refrigerant delivery portion of the casing portion and between the cooling fin portion and at least one of the two opening portions, the loss adding portion generating pressure loss in the refrigerant passing therethrough.

25 Claims, 12 Drawing Sheets

(51) Int. Cl.
F28F 9/02 (2006.01)
H05K 7/20 (2006.01)

(58) Field of Classification Search
CPC .... F28F 13/08; F28F 2210/10; F28F 2215/00;
H05K 7/20854; H05K 7/20936; H05K
7/20881; H05K 7/2029
See application file for complete search history.

(56) References Cited

U.S. PATENT DOCUMENTS

| 5,402,004 | A | 3/1995 | Burhan |
|---|---|---|---|
| 6,951,243 | B2 | 10/2005 | Nilson |
| 2006/0096742 | A1 | 5/2006 | Bhatti |
| 2006/0098411 | A1 | 5/2006 | Lee |
| 2008/0099191 | A1 | 5/2008 | Taras |
| 2009/0145581 | A1 | 6/2009 | Hoffman |
| 2009/0301125 | A1 | 12/2009 | Myles |
| 2010/0032139 | A1 | 2/2010 | Tian |
| 2010/0089559 | A1 | 4/2010 | Gorbounov |
| 2010/0090336 | A1 | 4/2010 | Yoshida |
| 2011/0132591 | A1 | 6/2011 | Morino |

| 2012/0018131 | A1 | 1/2012 | Chang |
|---|---|---|---|
| 2012/0024499 | A1 | 2/2012 | Chang |
| 2014/0252590 | A1 | 9/2014 | Gohara |
| 2015/0176937 | A1 | 6/2015 | Sullivan |

FOREIGN PATENT DOCUMENTS

| JP | H06120380 | A | 4/1994 |
|---|---|---|---|
| JP | 2006140435 | A | 6/2006 |
| JP | 2008251932 | A | 10/2008 |
| JP | 2011134979 | A | 7/2011 |
| JP | 2017050375 | A1 | 3/2017 |
| JP | 2017108078 | A | 6/2017 |
| WO | 2013054615 | A1 | 4/2013 |
| WO | 2013054887 | A1 | 4/2013 |
| WO | 2015177909 | A1 | 11/2015 |

OTHER PUBLICATIONS

Those references were submitted as IDS or over the earlier U.S.
Appl. No. 16/368,756, filed Mar. 28, 2019.
Office Action issued for counterpart Japanese Application No.
2022-125809, issued by the Japanese Patent Office on May 30, 2023
(drafted on May 24, 2023).

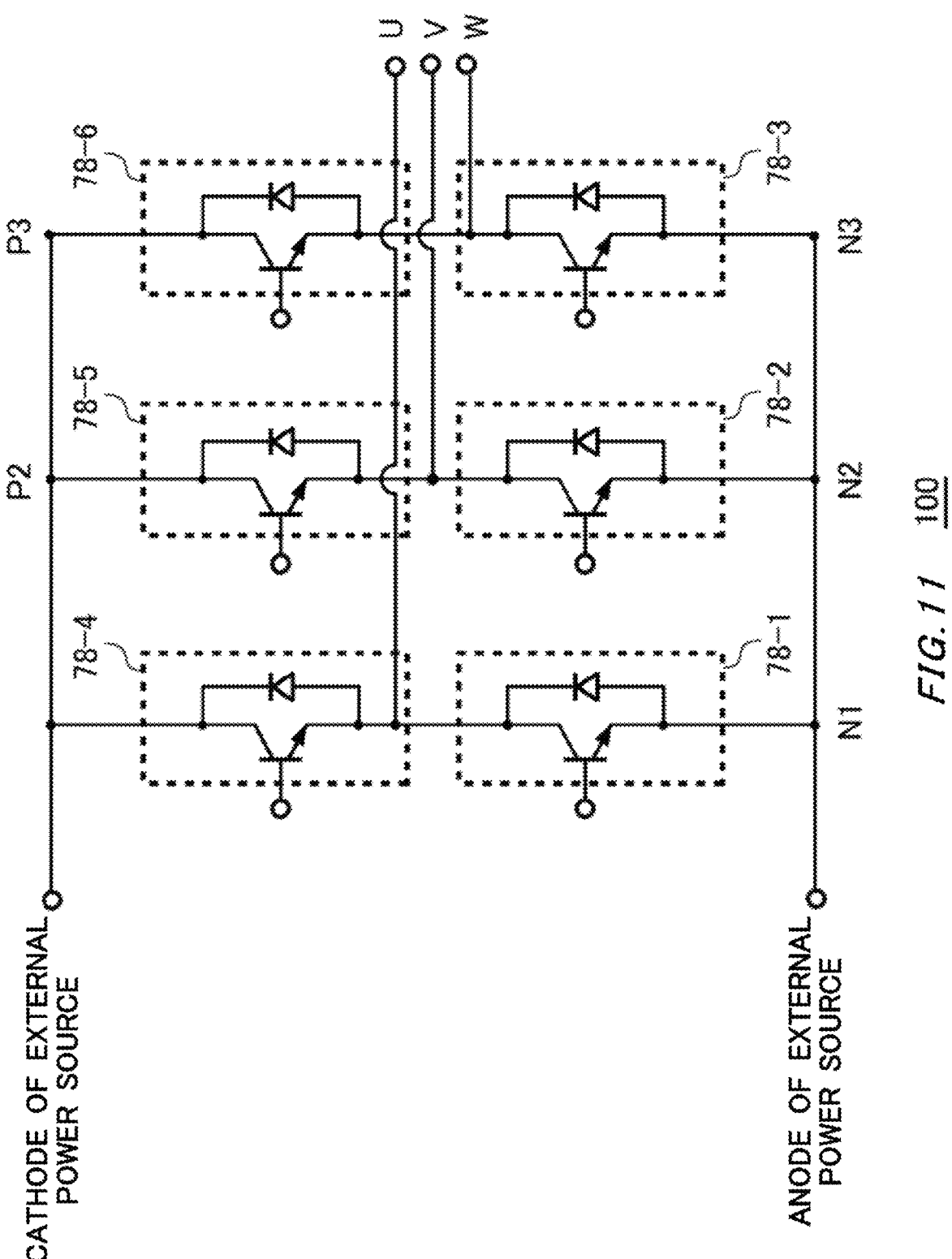
*FIG.11*    100

SEMICONDUCTOR COOLING APPARATUS WITH UNIFORM FLOW DISTRIBUTION STRUCTURES

CROSS-REFERENCE TO RELATED APPLICATIONS

This application is a continuation application of U.S. patent application Ser. No. 16/368,756, filed on Mar. 28, 2019, which claims priority to Japanese Patent Application No. 2018-088899 filed in JP on May 2, 2018, the contents of each of which are hereby incorporated herein by reference in their entirety.

BACKGROUND

1. Technical Field

The present invention relates to a cooling apparatus, a semiconductor module and a vehicle.

2. Related Art

In conventionally known configurations of semiconductor modules including semiconductor elements such as power semiconductor chips, cooling apparatuses are provided (for example, see Patent Literatures 1 to 2).

Patent Literature 1: Japanese Patent Application Publication No. 2011-134979

Patent Literature 2: WO2015/177909

SUMMARY

The flow speed distribution of a refrigerant in a cooling apparatus is preferably as uniform as possible.

In order to overcome the above-mentioned drawbacks, a first aspect of the present invention provides a cooling apparatus for a semiconductor module including a semiconductor chip. The cooling apparatus may include a top plate. The cooling apparatus may include a casing portion that has a base plate facing the top plate, and a refrigerant delivery portion arranged between the top plate and the base plate, the casing portion being provided with two opening portions to function as an inlet port through which a refrigerant is let into the refrigerant delivery portion and an outlet port through which the refrigerant is let out. The cooling apparatus may include a cooling fin portion that is arranged in the refrigerant delivery portion of the casing portion and between the two opening portions. The cooling apparatus may include at least one loss adding portion that is arranged in the refrigerant delivery portion of the casing portion and between the cooling fin portion and at least one of the two opening portions, the loss adding portion generating pressure loss in the refrigerant passing therethrough. Pressure loss that is generated when the refrigerant passes through the refrigerant delivery portion of the casing portion from which the cooling fin portion is removed, from one of the opening portions to the other opening portion may be equal to or larger than 5 kPa.

The loss adding portion may be isolated from the cooling fin portion.

Pressure loss in the refrigerant passing through the cooling fin portion may be smaller than pressure loss in the refrigerant passing through the loss adding portion.

When seen from above in a perpendicular direction to the top plate, an area of a region provided with the cooling fin portion may be larger than an area of a region provided with the loss adding portion.

The casing portion may have sidewalls extending from the base plate toward the top plate. When seen from above, the loss adding portion may extend from a first sidewall to a second sidewall opposite to the first sidewall.

The loss adding portion has a structure in which a plurality of openings through which the refrigerant passes may be arranged discretely between the first sidewall and the second sidewall.

The openings of the loss adding portion may be arranged at equal intervals.

Opening areas of the individual openings of the loss adding portion may be equal.

The cooling fin portion may be provided with the refrigerant flow passage through which the refrigerant passes. When seen from above, a width of the openings of the loss adding portion may be smaller than a width of the refrigerant flow passage of the cooling fin portion.

The at least one loss adding portion may include two loss adding portions, and the two loss adding portions are each provided between one of the opening portions and the cooling fin portion.

The two opening portions may have different opening areas. Pressure loss at the loss adding portion corresponding to one of the two opening portions that has a larger opening area may be larger than pressure loss at the loss adding portion corresponding to one of the two opening portions that has a smaller opening area.

The loss adding portion may be at least partially provided detachably to the refrigerant delivery portion.

A second aspect of the present invention provides a semiconductor module including: the cooling apparatus according to the first aspect; and a semiconductor device arranged above the cooling apparatus.

A third aspect of the present invention provides a vehicle including the semiconductor module according to the second aspect.

The summary clause does not necessarily describe all necessary features of the embodiments of the present invention. The present invention may also be a sub-combination of the features described above.

BRIEF DESCRIPTION OF THE DRAWINGS

FIG. 11 is a main circuit diagram of the semiconductor module 100 according to one embodiment of the present invention.

DESCRIPTION OF EXEMPLARY
EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
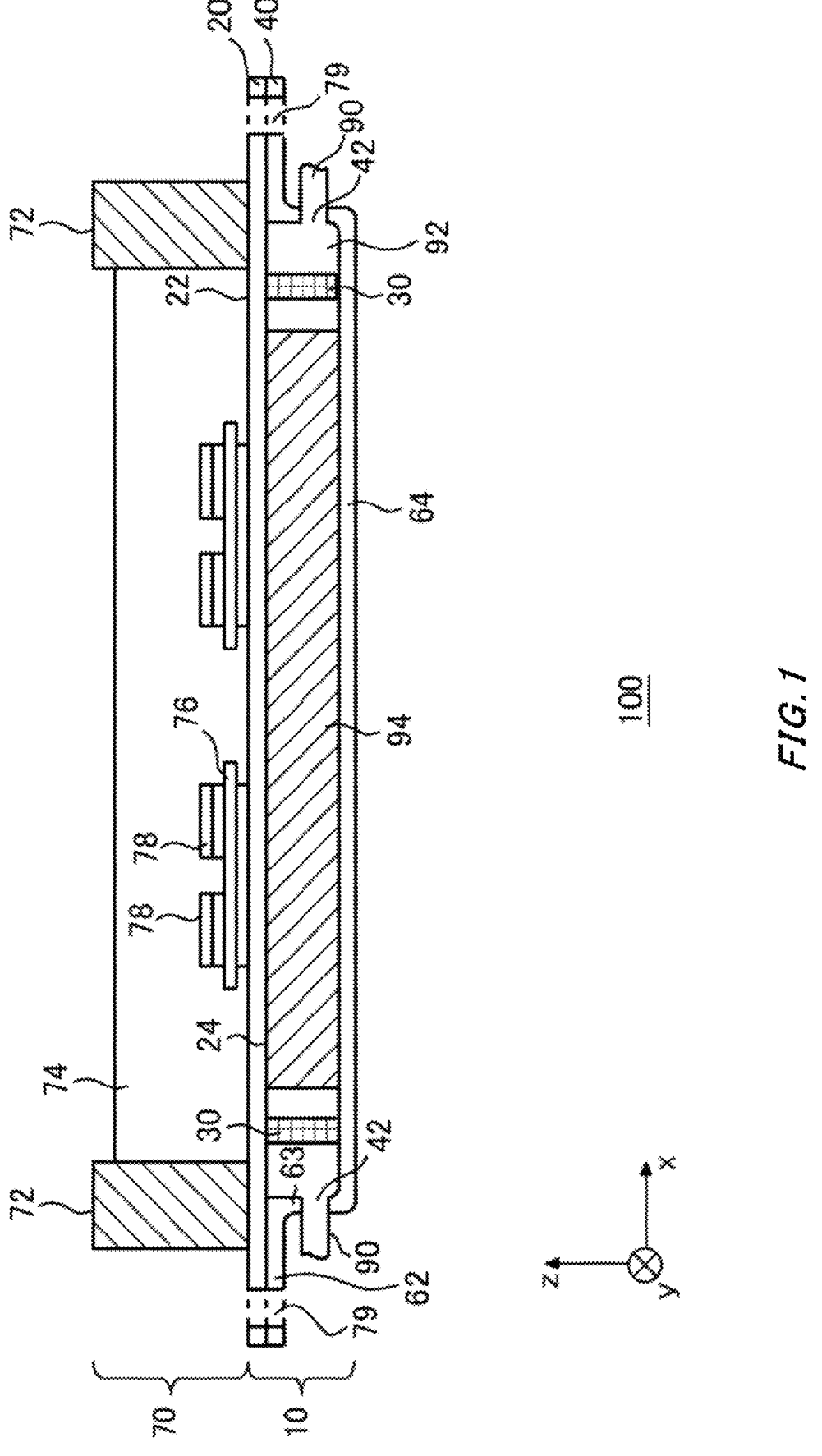
FIG. 1 is a schematic sectional view illustrating one example of a semiconductor module 100 according to one embodiment of the present invention.

FIG. 1 is a schematic sectional view illustrating one example of a semiconductor module 100 according to one embodiment of the present invention. The semiconductor module 100 includes a semiconductor device 70 and a cooling apparatus 10. The semiconductor device 70 in the present example is placed on the cooling apparatus 10. In the present specification, a surface of the cooling apparatus 10 on which the semiconductor device 70 is placed is defined as the x-y plane, and a plane perpendicular to the x-y plane is defined as the z-axis. In the present specification, the direction from the cooling apparatus 10 toward the semiconductor device 70 in the z-axis direction is referred to as the upward direction, and the opposite direction is referred to as the downward direction, but the upward/downward direction is not limited to the direction of gravity. In addition, in the present specification, among surfaces of each member, the surface on the upper side is referred to as the upper surface, the surface on the lower side is referred to as the lower surface, and surfaces between the upper surface and the lower surface are referred to as side surfaces.

The semiconductor device 70 includes one or more semiconductor chips 78 such as power semiconductor chips. For example, a semiconductor chip 78 is provided with an insulated-gate bipolar transistor (IGBT) formed in a semiconductor substrate such as a silicon substrate.

The semiconductor device 70 has a circuit substrate 76 and a housing portion 72. The circuit substrate 76 is, for example, an insulating substrate provided with a circuit pattern. The semiconductor chips 78 are fixed to the circuit substrate 76 via solder or the like. The housing portion 72 is formed of an insulating material such as a resin. The housing portion 72 has an internal space that houses the semiconductor chips 78, the circuit substrate 76, wires, and the like. The internal space of the housing portion 72 may be filled with a sealing portion 74 that seals in the semiconductor chips 78, the circuit substrate 76, wires and the like. The sealing portion 74 is an insulating member such as a silicone gel or an epoxy resin, for example.

The cooling apparatus 10 has a top plate 20 and a casing portion 40. The top plate 20 may be a tabular metal plate having an upper surface 22 and a lower surface 24 that are parallel to the x-y plane. For example, the top plate 20 is formed of an aluminum-containing metal. The semiconductor device 70 is placed on the upper surface 22 of the top plate 20. Heat generated by the semiconductor chip 78 is transferred to the top plate 20. For example, thermally conductive members such as the circuit substrate 76, a metal plate or solder are arranged between the top plate 20 and the semiconductor chip 78.

The circuit substrate 76 may be fixed directly to the upper surface 22 of the top plate 20 by solder or the like. In this case, the housing portion 72 is provided to surround a region of the upper surface 22 of the top plate 20 where the circuit substrate 76 and the like are arranged. In another example, the semiconductor device 70 may have a metal plate exposed to the lower surface of the housing portion 72, the circuit substrate 76 may be fixed to the upper surface of the metal plate, and the metal plate may be fixed to the upper surface 22 of the top plate 20.

The casing portion 40 is arranged to provide a refrigerant delivery portion 92 between the lower surface 24 of the top plate 20 and a base plate 64. The casing portion 40 may be formed integrally with the top plate 20, or may be formed as a separate member from the top plate 20. The refrigerant delivery portion 92 is a region where a refrigerant such as water is delivered. The refrigerant delivery portion 92 may be a tightly sealed space in contact with the lower surface 24 of the top plate 20. In addition, in a region on the x-y plane that surrounds the refrigerant delivery portion 92, the casing portion 40 is arranged to closely adhere directly or indirectly to the lower surface 24 of the top plate 20. Thereby, the refrigerant delivery portion 92 is tightly sealed in. Note that "closely adhering indirectly" refers to the state where the lower surface 24 of the top plate 20 and the casing portion 40 closely adhere to each other via a sealing material, an adhesive, or another member that is provided between the lower surface 24 of the top plate 20 and the casing portion 40. "Closely adhering" refers to the state where a refrigerant inside the refrigerant delivery portion 92 does not leak through the closely adhering part.

A cooling fin portion 94 is arranged inside the refrigerant delivery portion 92. The cooling fin portion 94 may be connected to the lower surface 24 of the top plate 20. By causing a refrigerant to pass by the cooling fin portion 94, heat generated by the semiconductor chip 78 is transferred to a refrigerant. Thereby, the semiconductor device 70 can be cooled. The casing portion 40 in the present example has a frame portion 62, the base plate 64 and a sidewall 63.

The frame portion 62 is arranged to surround the refrigerant delivery portion 92 on the x-y plane. The frame portion 62 is arranged to closely adhere directly or indirectly to the lower surface 24 of the top plate 20. That is, the frame portion 62 and the lower surface 24 of the top plate 20 are provided to tightly seal in the refrigerant delivery portion 92. A sealing material or another member may be provided between the frame portion 62 and the lower surface 24 of the top plate 20.

In the present example, the top plate 20 and the casing portion 40 are brazed. For example, the top plate 20 and the casing portion 40 are formed of metals with the same composition, and a brazing material is formed of a metal with a lower melting point than that of the top plate 20 or the like.

The base plate 64 is arranged to provide the refrigerant delivery portion 92 between itself and the lower surface 24 of the top plate 20. The sidewall 63 connects the frame portion 62 and the base plate 64 to thereby define the refrigerant delivery portion 92. The sidewall 63 extends from the base plate 64 toward the top plate 20. The sidewall 63 in the present example is provided with two or more opening portions 42 through which a refrigerant is let into or let out of the refrigerant delivery portion 92. A pipe 90 through which the refrigerant is conveyed is connected to the opening portions 42. In another example, the opening portions 42 may be provided to the base plate 64.

The top plate 20 and casing portion 40 are provided with through holes 79 into which screws or the like for fastening them to each other are inserted. The through holes 79 may be used for fixing the semiconductor module 100 to an external apparatus. The through holes 79 are provided in a region where the top plate 20 and the frame portion 62 are arranged to closely adhere directly or indirectly and overlap in the z-axis direction.

The cooling fin portion 94 is provided between the two opening portions 42. One of the opening portions 42 sandwiching the cooling fin portion 94 functions as an inlet port through which a refrigerant is let into the refrigerant delivery portion 92, and the other opening portion 42 functions as an outlet port through which a refrigerant is let out of the refrigerant delivery portion 92. Which opening portion 42 is caused to function as which of an inlet port or an outlet port can be selected as appropriate by a user.

In addition, the refrigerant delivery portion 92 is provided with loss adding portions 30 that generate pressure loss in the refrigerant passing through the refrigerant delivery portion 92. A loss adding portion 30 or loss adding portions 30 is/are arranged between the cooling fin portion 94 and at least one of the two opening portions 42. In the example shown in FIG. 1, each of the opening portions 42 is provided with a loss adding portion 30.

The loss adding portions 30 generate pressure loss in the refrigerant passing through the refrigerant delivery portion 92 to thereby make the flow speed distribution of the refrigerant in the refrigerant delivery portion 92 uniform. A loss adding portion 30 may be provided over an entire cross-section of the refrigerant delivery portion 92 between the cooling fin portion 94 and an opening portion 42. The loss adding portion 30 may be a member in which blocking parts to block passage of a refrigerant and opening parts to allow passage of the refrigerant are arranged in a mesh pattern over the entire cross-section. By causing the loss adding portion 30 to generate large pressure loss, the pressure of a refrigerant upstream of the loss adding portion 30 increases, and the pressure applied to surfaces of the loss adding portion 30 is equalized. Thereby, the flow speeds of the refrigerant passing through individual opening parts of the loss adding portion 30 can be equalized. By providing the loss adding portion 30 over the entire cross-section, the flow speed of the entire refrigerant flowing toward the cooling fin portion 94 can be made uniform.

Figure 2:
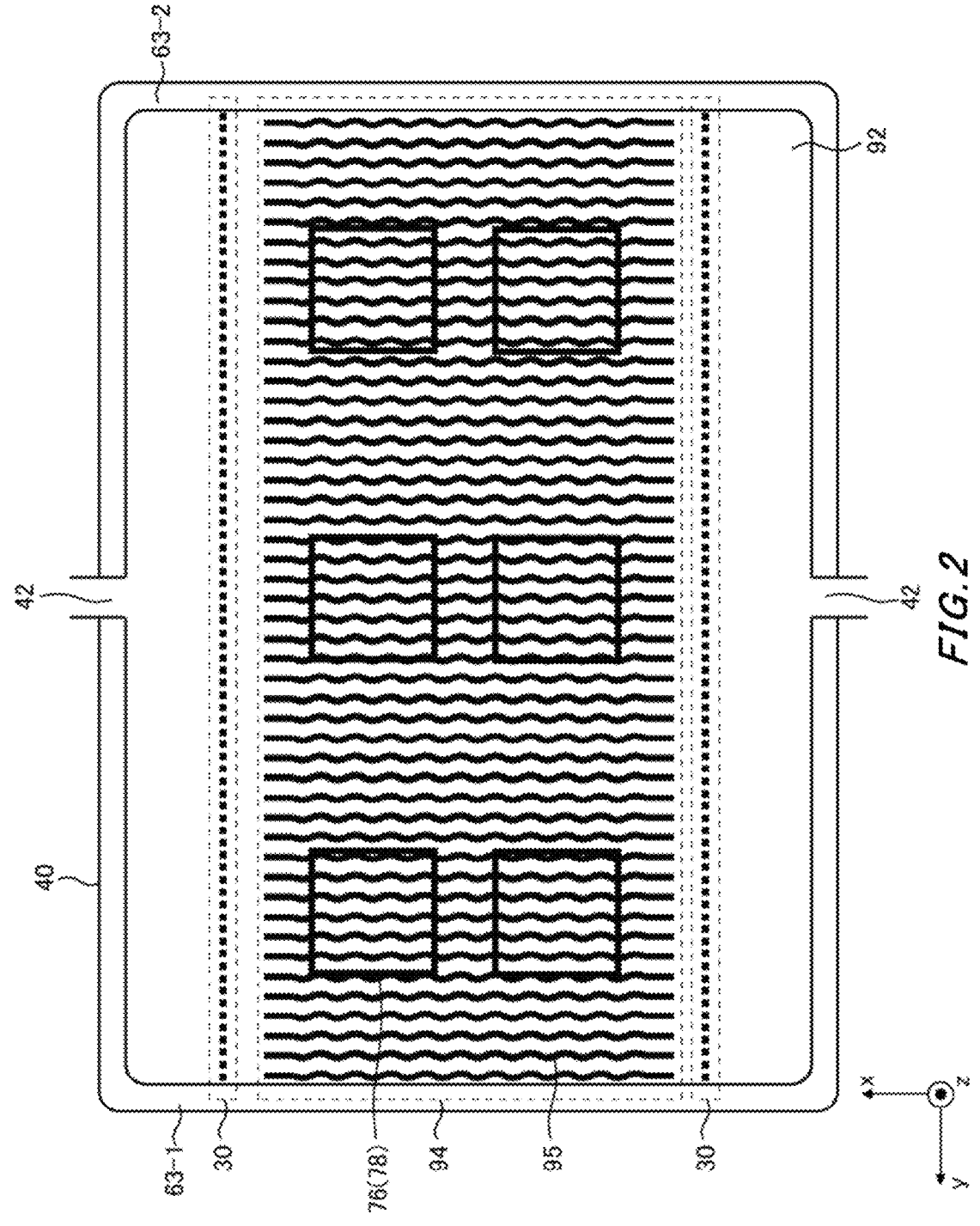
FIG. 2 is a figure illustrating an arrangement example of a cooling fin portion 94 and loss adding portions 30 on the x-y plane.

FIG. 2 is a figure illustrating an arrangement example of the cooling fin portion 94 and loss adding portions 30 on the x-y plane. In the present specification, the figure along the x-y plane is referred to as the top view in some cases. In addition, in FIG. 2, regions on the x-y plane onto which circuit substrates 76 having semiconductor chips 78 mounted thereon are projected are indicated by solid lines.

In the present example, the cooling fin portion 94 includes structures that are connected to the lower surface 24 of the top plate 20 and project downward from the lower surface 24. In addition, the cooling fin portion 94 includes the structures below the semiconductor chip 78 and structures provided continuously from the structures. In addition, structures that have the same shapes as those of the structures below the semiconductor chip 78 and are arranged in the refrigerant delivery portion 92 at predetermined intervals are included in the cooling fin portion 94, even if those structures are isolated from the structures below the semiconductor chip 78.

In the example shown in FIG. 2, structures 95 with wave shapes on the x-y plane are provided below semiconductor chips 78. The structures 95 extend in the x-axis direction, and are arranged at constant intervals in the y-axis direction. Each structure 95 is a tabular member approximately perpendicularly to the x-y plane. In the present example, all the structures 95 are treated as the cooling fin portion 94.

In another example, the cooling fin portion 94 may include columnar structures that are approximately perpendicularly to the x-y plane and arranged in a predetermined pattern on the x-y plane. In another example, the cooling fin portion 94 may be one formed by stacking, in the z-axis direction, tabular structures that are provided approximately parallel to the x-y plane and are provided with openings to serve as refrigerant flow passages. Note that structure of the cooling fin portion 94 is not limited to them. Specific examples of structures in the cooling fin portion 94 may be blades (tabular bodies), corrugated bodies or pins. Blades may be straight-shaped, zigzag-shaped as shown in FIG. 2 or wave-shaped.

Loss adding portions 30 are provided over a predetermined entire y-z cross-section in the refrigerant delivery portion 92, for example. The loss adding portions 30 extend from a first sidewall 63-1 of the casing portion 40 to a second sidewall 63-2 opposite to the first sidewall 63-1. The loss adding portions 30 have shapes different from the cooling fin portion 94. In addition, the loss adding portions 30 may be provided being isolated from the cooling fin portion 94.

The cooling apparatus 10 is provided with loss adding portions 30 such that pressure loss that is generated when a refrigerant passes through the refrigerant delivery portion 92 of the casing portion 40 from which the cooling fin portion 94 is removed, from one opening portion 42 to the other opening portion 42 becomes equal to or larger than 5 kPa. Pressure loss is the difference between the pressure of a refrigerant let in from one opening portion 42 and the pressure of the refrigerant discharged from the other opening portion 42. Pressure loss is measured under conditions of: an ethylene glycol 50 vol % solution as the refrigerant; the temperature of 65° C.; and the flow rate of 10 L/min. In an environment in which the semiconductor module 100 or an apparatus on which the semiconductor module 100 is implemented is operated, the cooling apparatus 10 may be used with a refrigerant at the temperature of −40 to 120° C. being caused to flow at the flow rate of 3 to 20 L/min, for example. Refrigerants that can be used include known refrigerants, for example, water or coolant (an ethylene glycol solution with the concentration of 30 to 70 vol %).

Figure 3A:
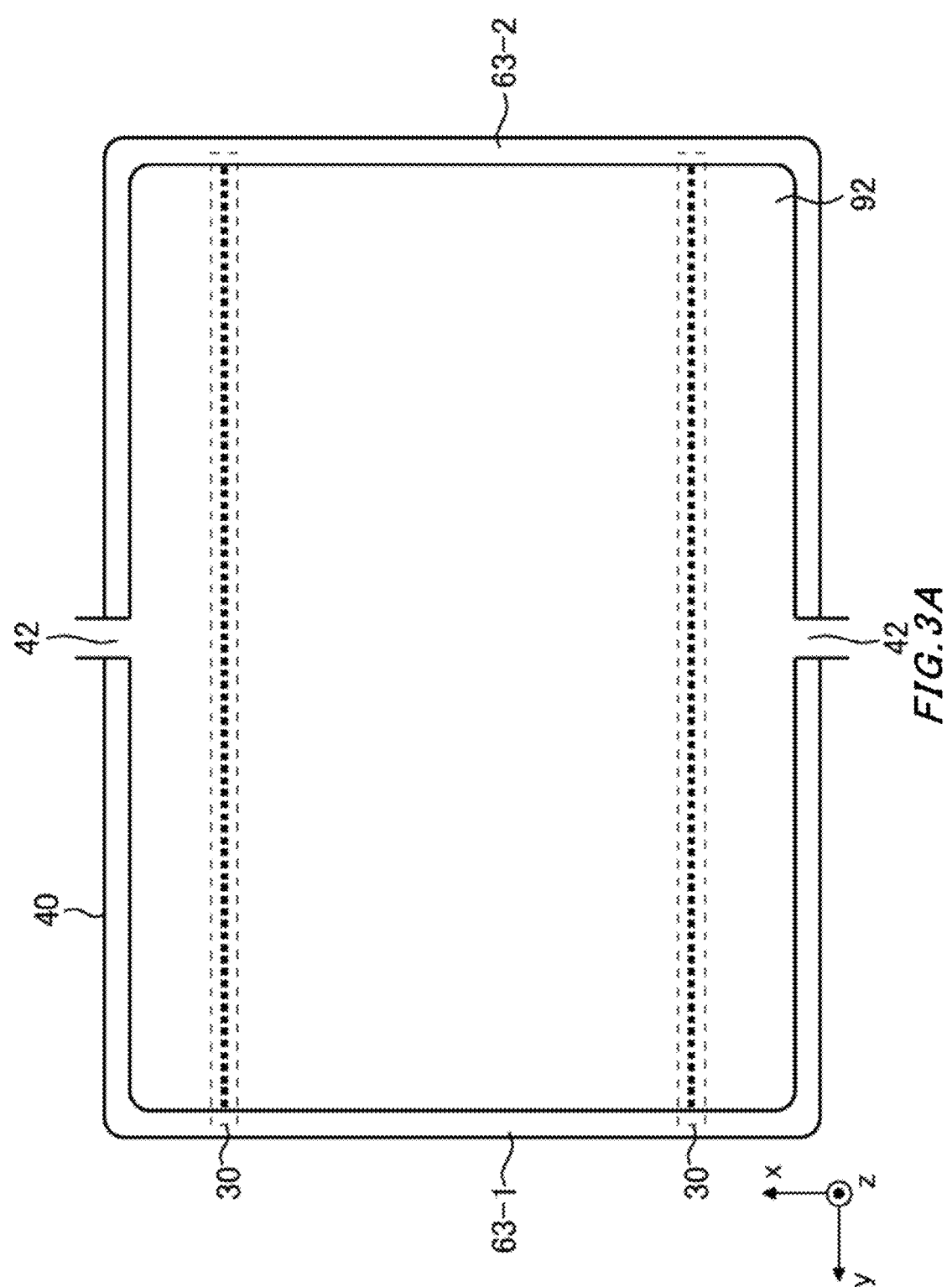
FIG. 3A is a figure illustrating a refrigerant delivery portion 92 from which the cooling fin portion 94 is removed.

FIG. 3A is a figure illustrating the refrigerant delivery portion 92 from which the cooling fin portion 94 is removed. In the state where the cooling fin portion 94 is removed, and loss adding portions 30 are left unremoved, the loss adding portions 30 to attain pressure loss between the two opening portions 42 of 5 kPa or higher are provided. By providing such loss adding portions 30, pressure loss increases, but the flow speed distribution of the refrigerant in the refrigerant delivery portion 92 can be made uniform. The loss adding portions 30 may have opening parts, through which a refrigerant is allowed to pass, having the same opening area. In addition, the loss adding portions 30 may have opening parts that are distributed uniformly on the y-z plane. Even if pressure loss increases, but if the power of a pump to let in the refrigerant is sufficiently high, the refrigerant can pass through the refrigerant delivery portion 92 at a certain speed or faster.

Pressure loss between the two opening portions 42 in the state where the cooling fin portion 94 is removed, and the loss adding portions 30 are left unremoved may be equal to or lower than 10 kPa, may be equal to or lower than 8 kPa, or may be equal to or lower than 6 kPa. Thereby, it is possible to prevent the energy loss from becoming excessively large.

As shown in FIG. 2, if the two opening portions 42 are provided at positions to face each other in the x-axis direction, the flow speed of a refrigerant passing through a refrigerant flow passage between the two opening portions 42 becomes relatively fast. In contrast to this, by providing the loss adding portions 30, the flow speed distribution of a refrigerant in the refrigerant delivery portion 92 could be made approximately uniform in the y-axis direction.

Note that pressure loss in the refrigerant passing through the cooling fin portion 94 may be smaller than pressure loss in the refrigerant passing through the loss adding portions 30. If a plurality of loss adding portions 30 are provided, pressure loss in the refrigerant passing through the loss adding portions 30 is measured in terms of the total sum of pressure loss at the plurality of loss adding portions 30. By increasing pressure loss at the loss adding portions 30, the flow speed distribution of a refrigerant at the refrigerant delivery portion 92 can be made uniform irrespective of the shape of the cooling fin portion 94 or the like. Pressure loss at the loss adding portions 30 may be twice as large as or three times as large as pressure loss at the cooling fin portion 94 or larger.

Figure 3B:
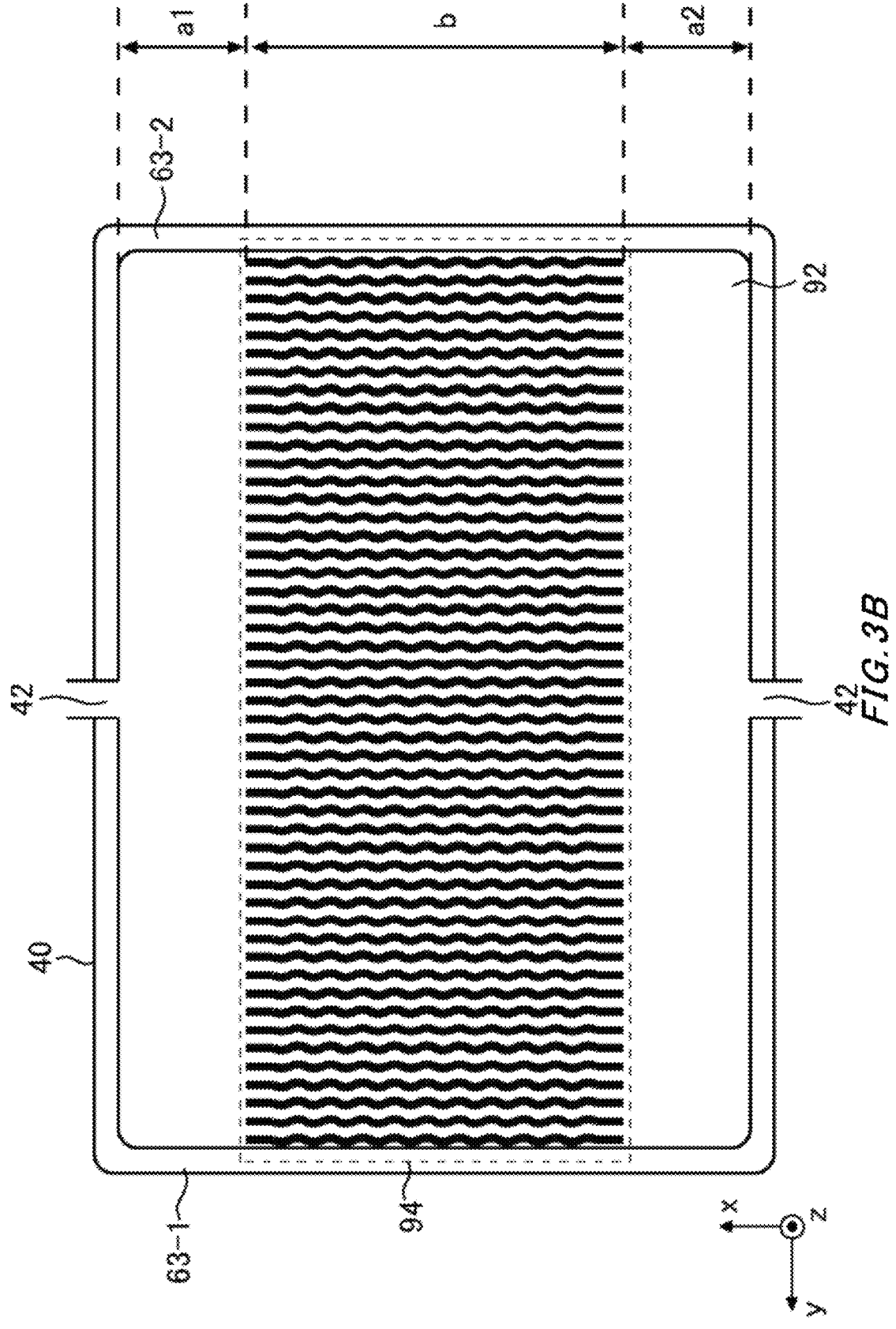
FIG. 3B is a figure illustrating the refrigerant delivery portion 92 from which loss adding portions 30 are removed.

FIG. 3B is a figure illustrating the refrigerant delivery portion 92 from which loss adding portions 30 are removed. The loss adding portions 30 are removed, but the cooling fin portion 94 is left unremoved. Pressure loss between the two opening portions 42 in this state may be used as pressure loss at the cooling fin portion 94. Pressure loss between the two opening portions 42 in the state where the cooling fin portion 94 is removed, and the loss adding portions 30 are left unremoved like the state shown in FIG. 3A may be used as pressure loss at the loss adding portions 30. Alternatively, the difference between pressure loss measured in the state where the cooling fin portion 94 and loss adding portions 30 are left unremoved as shown in FIG. 2 and pressure loss measured in the state where the cooling fin portion 94 is removed as shown in FIG. 3A may be used as pressure loss at the cooling fin portion 94. When seen from above, the width b in the x-axis direction of the cooling fin portion 94 may be larger than each of the widths a1, a2 in the x-axis direction of the refrigerant delivery portion 92 in regions not provided with the cooling fin portion 94. That is, in the refrigerant delivery portion 92, the volume of each space in the refrigerant delivery portion 92 before or after the cooling fin portion 94 other than the space that corresponds to the region provided with the cooling fin portion 94 may be smaller than the volume of the space occupied by the cooling fin portion 94. The width b may be larger than the sum of the widths a1 and a2.

Figure 4:
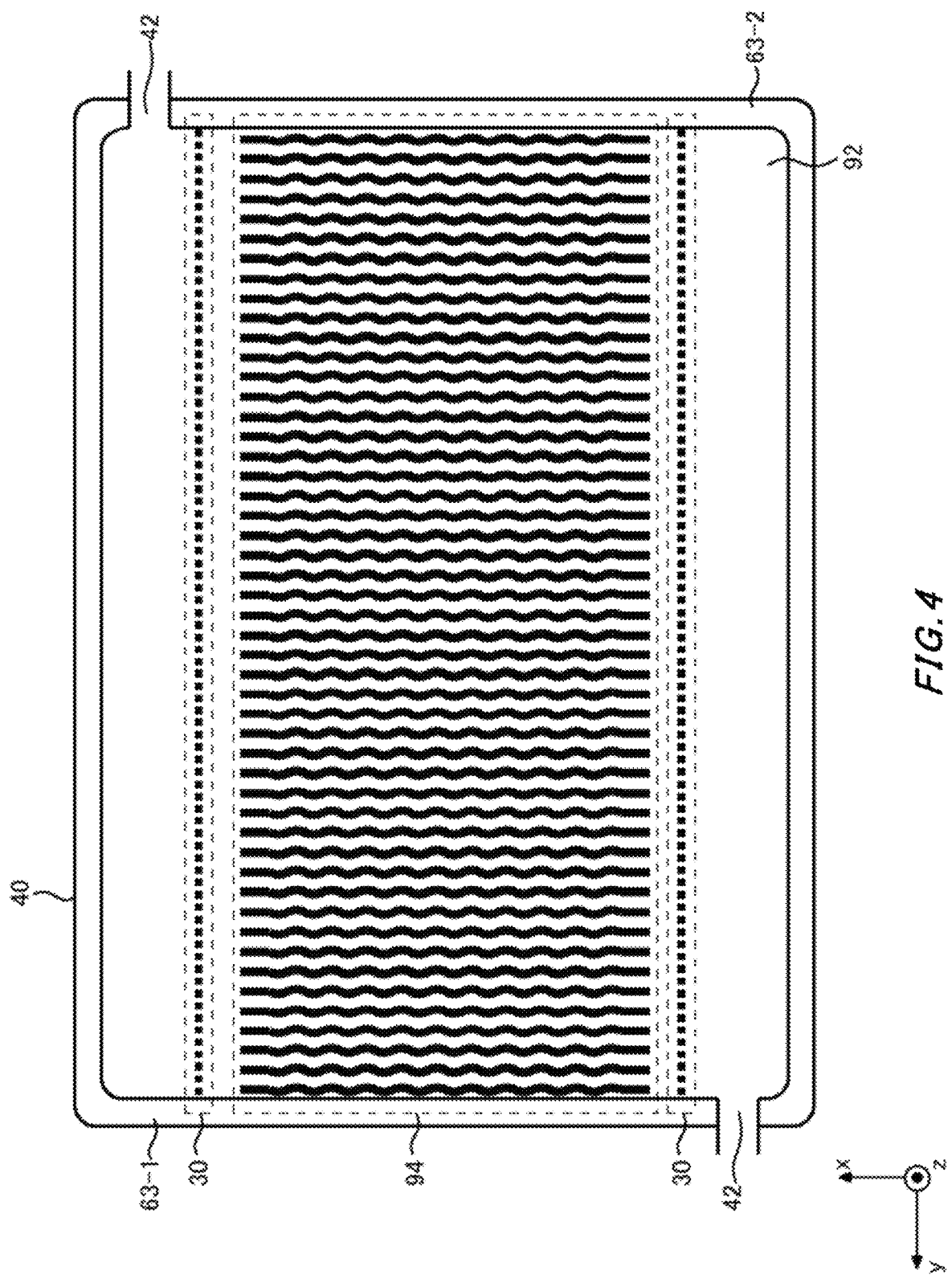
FIG. 4 is a figure illustrating another arrangement example of two opening portions 42.

FIG. 4 is a figure illustrating another arrangement example of the two opening portions 42. The opening portions 42 in the present example are provided to the sidewall 63-1 and the sidewall 63-2. In this case, it becomes easier for a refrigerant let in from an opening portion 42 to flow along the y-axis direction. Because of this, it becomes easier for the speed of a refrigerant passing through the cooling fin portion 94 to become faster at positions apart from the opening portions 42 in the y-axis direction. In such an arrangement also, the flow speed distribution of a refrigerant in the refrigerant delivery portion 92 could be made uniform in the y-axis direction by providing loss adding portions 30.

Figure 5:
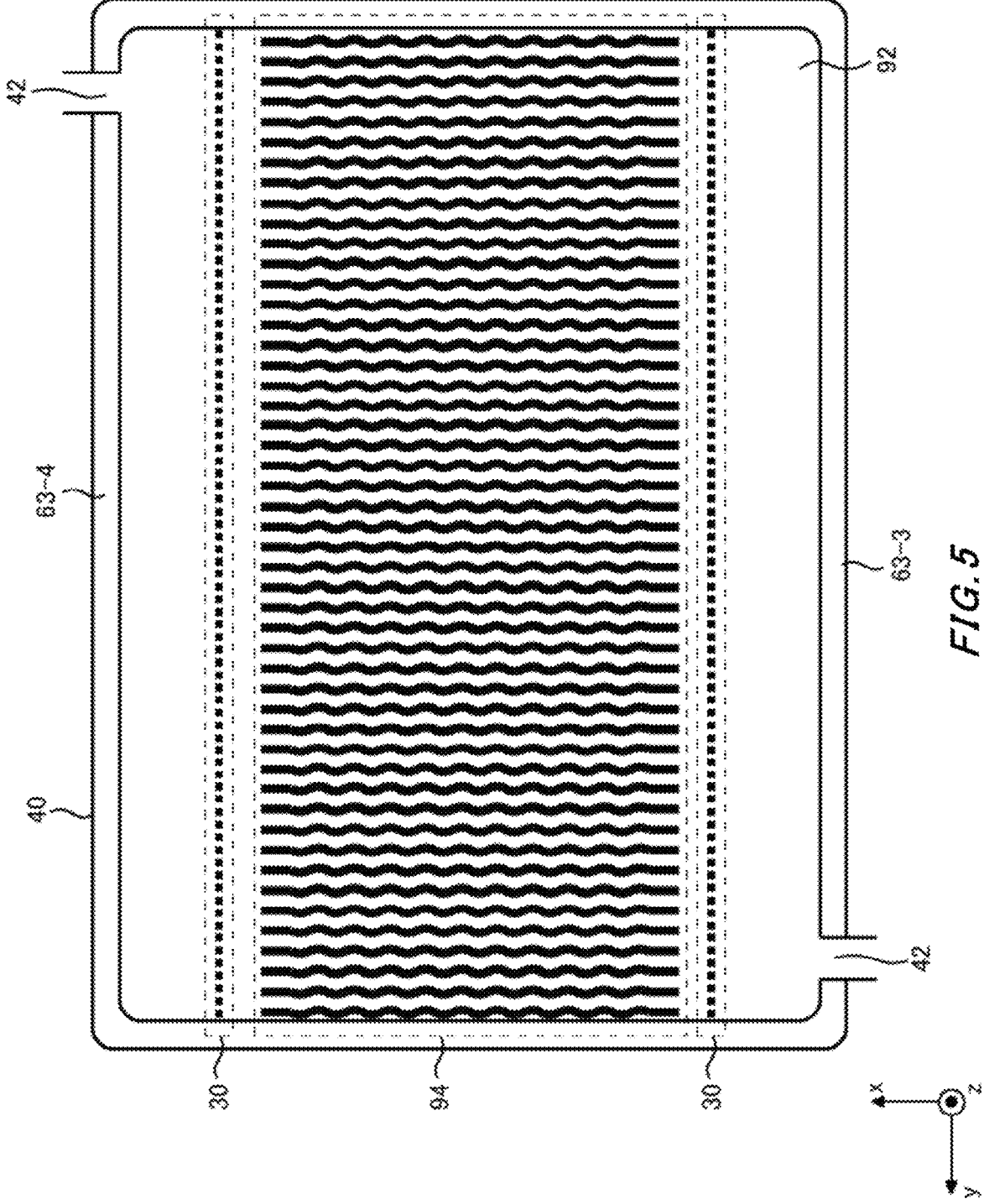
FIG. 5 is a figure illustrating another arrangement example of the two opening portions 42.

FIG. 5 is a figure illustrating another arrangement example of the two opening portions 42. The opening portions 42 in the present example are arranged at positions that are along sidewalls 63-3, 63-4 facing the cooling fin portion 94 in the x-axis direction and do not face each other in the x-axis direction. In this case, it becomes easier for the speed of a refrigerant passing through the cooling fin portion

94 to become faster at positions facing the opening portions 42. In such an arrangement also, the flow speed distribution in the refrigerant delivery portion 92 could be made uniform by providing the loss adding portions 30. In this manner, the flow speed distribution of a refrigerant in the refrigerant delivery portion 92 could be made uniform in the y-axis direction by providing the loss adding portions 30, irrespective of the arrangement of the opening portions 42.

Figure 6:
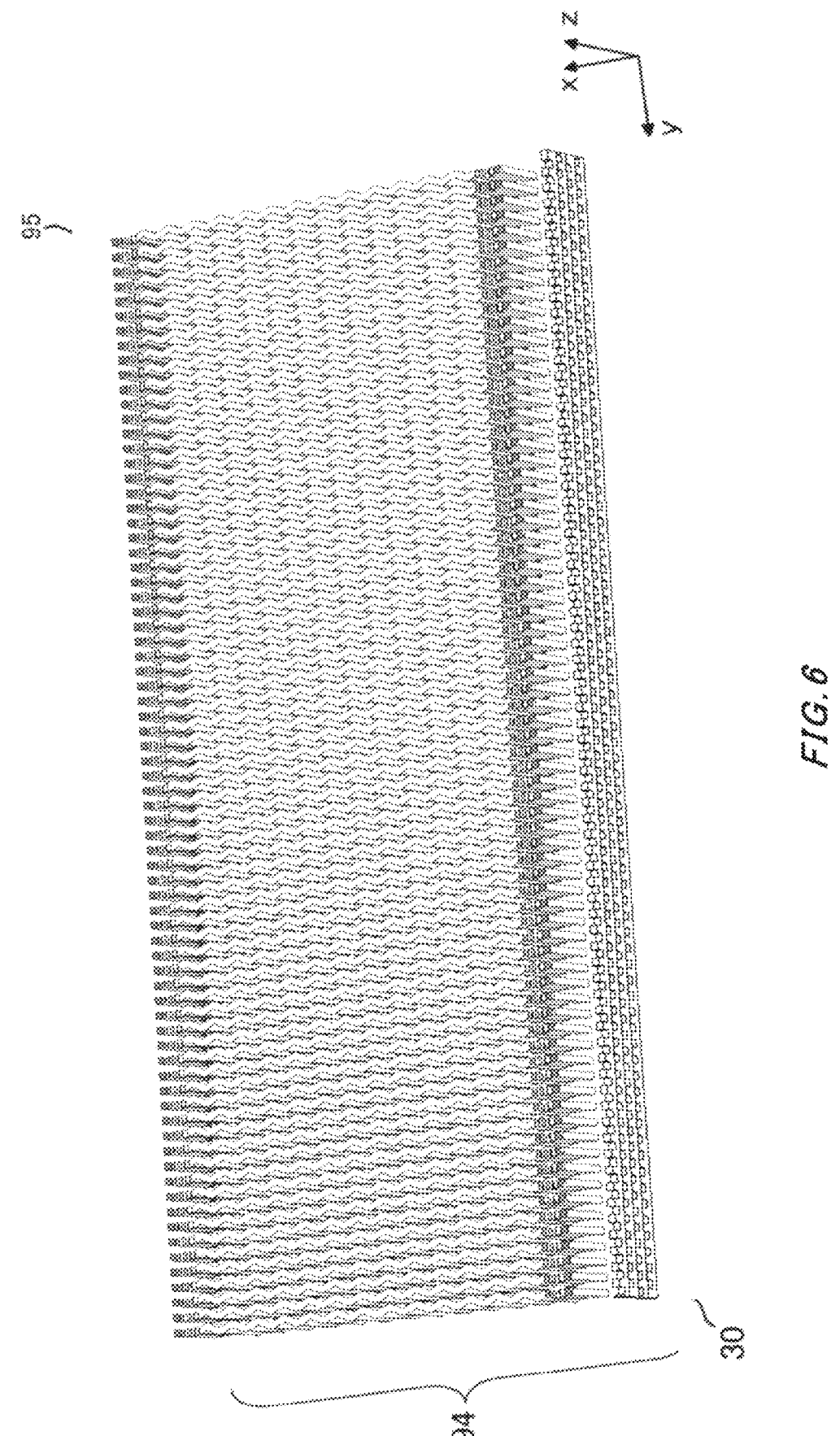
FIG. 6 is a perspective view illustrating one example of the cooling fin portion 94 and a loss adding portion 30.

FIG. 6 is a perspective view illustrating one example of the cooling fin portion 94 and a loss adding portion 30. The cooling fin portion 94 in the present example has tabular structures 95 having wave shapes on the x-y plane that are arrayed at constant intervals in the y-axis direction. Spaces between the structures 95 function as the refrigerant flow passage through which a refrigerant is allowed to pass.

On the x-y plane, the area of a region provided with the cooling fin portion 94 is preferably larger than the area of a region provided with the loss adding portion 30. Thereby, an increase of the apparatus size that may result because the loss adding portion 30 is provided can be suppressed. The area of the refrigerant flow passage between the structures 95 on the x-y plane may be included in the area of the cooling fin portion 94. The area of the refrigerant flow passage between the structures may be included similarly in the area of the loss adding portion 30. For example, the areas of the cooling fin portion 94 and the loss adding portion 30 used may be the area of the smallest rectangle circumscribing the cooling fin portion 94 and the area of the smallest rectangle circumscribing the loss adding portion 30 on the x-y plane.

In the present example, the width of the cooling fin portion 94 and the width of the loss adding portion 30 in the y-axis direction are equal. In contrast to this, the width of the cooling fin portion 94 in the x-axis direction is larger than the width of the loss adding portion 30 in the x-axis direction. In the x-axis direction, the width of the loss adding portion 30 may be 10% of the width of the cooling fin portion 94 or smaller, or may be 5% of the width of the cooling fin portion 94 or smaller.

Figure 7:
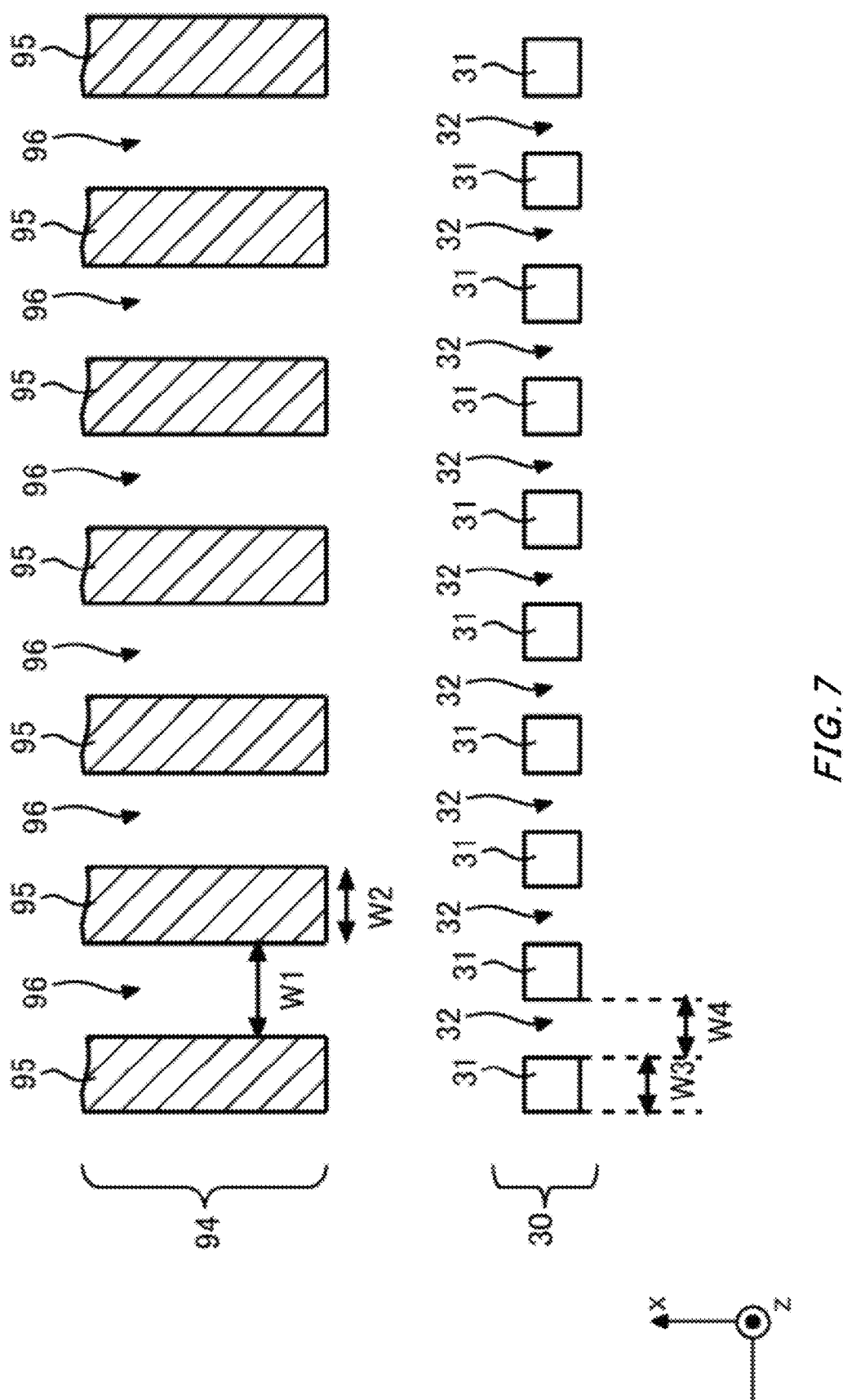
FIG. 7 is a top view for explaining main points of the cooling fin portion 94 and a loss adding portion 30.

FIG. 7 is a top view for explaining main points of the cooling fin portion 94 and a loss adding portion 30. The cooling fin portion 94 in the present example has a plurality of structures 95 that are arrayed in the y-axis direction. Parts that are sandwiched by the structures 95 function as refrigerant flow passages 96 that allow passage of a refrigerant from the side of one opening portion 42 to the side of the other opening portion 42. The loss adding portion 30 in the present example includes shields 31 and openings 32 that are arranged alternately in the y-axis direction. The openings 32 are arranged discretely between the sidewall 63-1 and the sidewall 63-2 as shown in FIG. 2. The openings 32 may be arranged discretely also in the z-axis direction.

In the y-axis direction, the width W4 of the openings 32 of the loss adding portion 30 is smaller than the width W1 of the refrigerant flow passages 96 of the cooling fin portion 94. The width W4 may be equal to or smaller than the width W1, or may be equal to or smaller than ¼ of the width W1. In addition, the width W4 of the openings 32 may be smaller than the width W3 of the shields 31. The width W4 may be equal to or smaller than the width W3, may be equal to or smaller than ¼ of the width W3, or may be equal to or smaller than ¹⁄₁₀ of the width W3. By making the width W4 of the openings 32 small, pressure loss at the loss adding portion 30 can be increased.

In addition, the pitch W3+W4 at which the openings 32 are provided may be equal to or smaller than the pitch at which the refrigerant flow passages 96 are provided (the sum W1+W2 of the width W1 of the refrigerant flow passages 96 and the width W2 of the structures 95). The pitch W3+W4 may be smaller than the width W1 of the refrigerant flow passages 96. By making the pitch W3+W4 small, at least one opening 32 can be arranged for each refrigerant flow passage 96.

Figure 8:
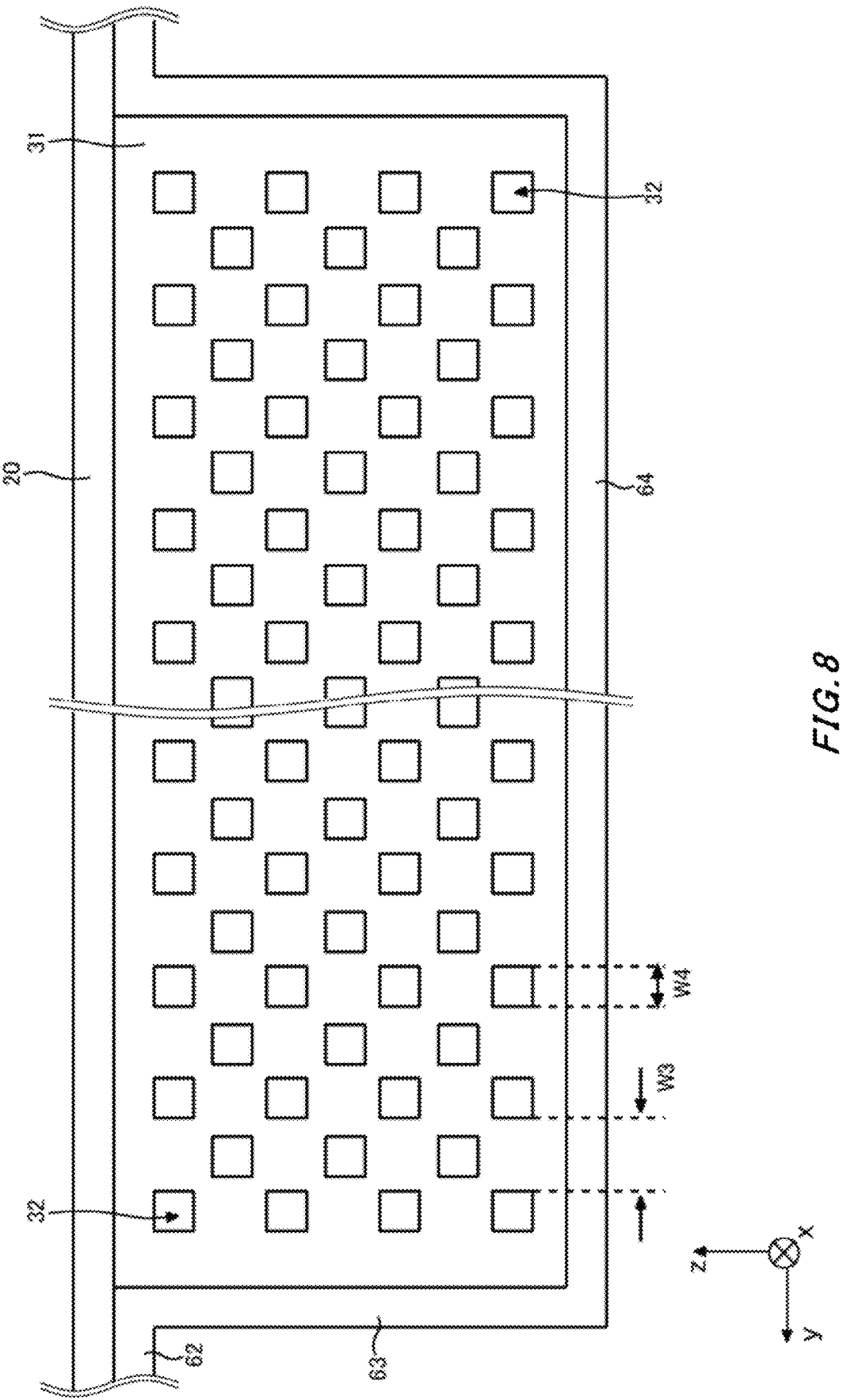
FIG. 8 is a figure illustrating a structural example of a loss adding portion 30 on the y-z plane.

FIG. 8 is a figure illustrating a structural example of a loss adding portion 30 on the y-z plane. The loss adding portion 30 may have a tabular shield 31 that is parallel to the y-z plane. The shield 31 is provided over an entire y-z cross-section of the refrigerant delivery portion 92. The shield 31 is provided with openings 32 that are arranged two-dimensionally discretely. The openings 32 are preferably arranged at equal intervals on the y-z plane. In addition, the opening areas of the individual openings 32 are preferably equal. Thereby, the flow speed of a refrigerant on the y-z plane can be made uniform. Predetermined magnitudes of error may be tolerated for the openings to be regarded as being arranged at the equal intervals and having an equal area. For example, if errors between the intervals and the areas are within 5%, they may be regarded as equal intervals or the same areas.

The loss adding portion 30 may be one formed by punching the openings 32 in a metal plate in a predetermined pattern. A loss adding portion 30 in another example may be formed by wires such as metal wires being placed to cross each other, may be formed of plastic, or may be formed of fibers.

Figure 9:
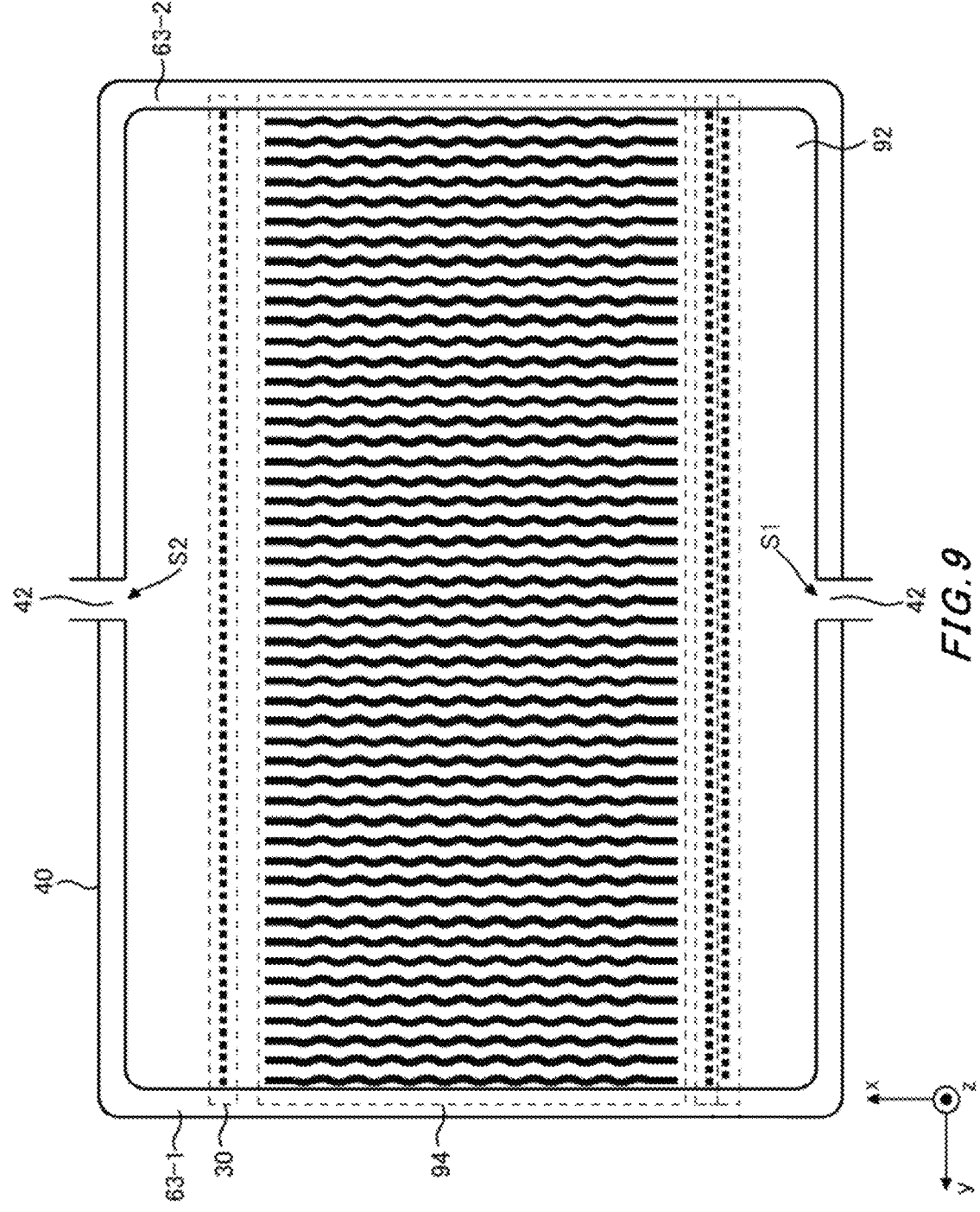
FIG. 9 is a top view illustrating another arrangement example of loss adding portions 30.

FIG. 9 is a top view illustrating another arrangement example of loss adding portions 30. In the present example, a plurality of loss adding portions 30 are arrayed in the x-axis direction between at least one opening portion 42 and the cooling fin portion 94. The structure of each loss adding portion 30 is the same as the structure shown in FIG. 8, for example. The individual loss adding portions 30 may be arranged apart from each other in the x-axis direction. The positions of the openings 32 on the y-z plane may be different between the individual loss adding portions 30. With such a structure, the total sum of pressure loss at the loss adding portions 30 can be increased. Note that the thickness of one loss adding portion 30 in the x-axis direction may be equal to or smaller than 1 mm.

In addition, the opening areas S1, S2 of the two opening portions 42 may be different. The total sum of pressure loss at one or more loss adding portions 30 corresponding to an opening portion 42 with a larger opening area may be larger than the total sum of pressure loss at one or more loss adding portions 30 corresponding to an opening portion 42 with a smaller opening area. Thereby, variations in the flow speed can be reduced by increasing pressure loss on the side where variations in the flow speed easily occurs. In addition, a loss adding portion 30 may be provided for an opening portion 42 with a larger opening area, and a loss adding portion 30 may not be provided for an opening portion 42 with a smaller opening area.

In addition, at least some loss adding portions 30 may be attachable to and detachable from the refrigerant delivery portion 92. Thereby, the number of loss adding portions 30 provided between the opening portions 42 and the cooling fin portion 94 can be adjusted, and pressure loss to be generated can be adjusted.

Figure 10:
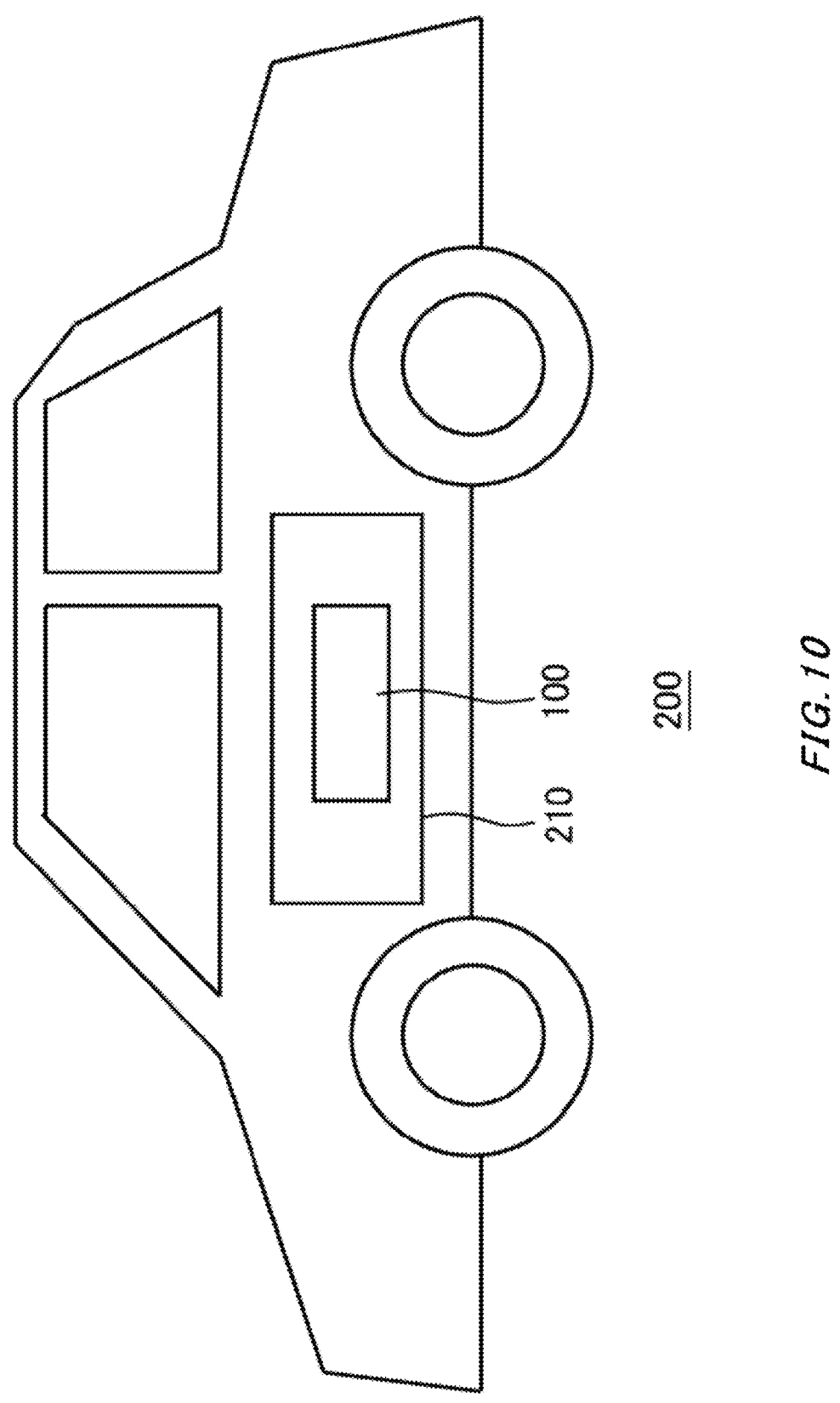
FIG. 10 is a figure illustrating main points of a vehicle 200 according to one embodiment of the present invention.

FIG. 10 is a figure illustrating main points of a vehicle 200 according to one embodiment of the present invention. The vehicle 200 is a vehicle that generates at least partial propulsive force using electric power. For example, the vehicle 200 is an electric car that generates entire propulsive force using an electrically-driven device such as a motor, or a hybrid car that uses both an electrically-driven device such as a motor and an internal combustion engine driven using fuel such as gasoline.

The vehicle 200 includes a control apparatus 210 (an external apparatus) that controls an electrically-driven device such as a motor. The control apparatus 210 is provided with the semiconductor module 100. The semiconductor module 100 may control electric power to be supplied to the electrically-driven device. The vehicle 200 may be a large-sized vehicle such as a bus, a heavy machine or a truck. In this case, it becomes easy to use a large-sized pump as a pump to supply a refrigerant to the cooling apparatus 10, and the refrigerant can be supplied easily to the cooling apparatus 10 with large pressure loss.

FIG. 11 is a main circuit diagram of the semiconductor module 100 according to one embodiment of the present invention. The semiconductor module 100 may be part of a vehicle-mounted unit that drives a motor of a vehicle. The semiconductor module 100 may function as a three-phase AC inverter circuit having output terminals U, V and W.

Semiconductor chips 78-1, 78-2 and 78-3 may constitute a lower arm in the semiconductor module 100, and a plurality of semiconductor chips 78-4, 78-5 and 78-6 may constitute an upper arm in the semiconductor module 100. A set of the semiconductor chips 78-1, 78-4 may constitute a leg. A set of the semiconductor chips 78-2, 78-5 and a set of the semiconductor chips 78-3, 78-6 may similarly constitute legs. In the semiconductor chip 78-1, the emitter electrode may be electrically connected to an input terminal N1, and the collector electrode may be electrically connected to an output terminal U. In the semiconductor chip 78-4, the emitter electrode may be electrically connected to the output terminal U, and the collector electrode may be electrically connected to an input terminal P1. Similarly, in the semiconductor chips 78-2, 78-3, the emitter electrodes may be electrically connected to input terminals N2, N3, respectively, and the collector electrodes may be electrically connected to output terminals V, W, respectively. Furthermore, in the semiconductor chips 78-5, 78-6, the emitter electrodes may be electrically connected to the output terminals V, W, respectively, and the collector electrodes may be electrically connected to input terminals P2, P3, respectively.

Each semiconductor chip 78-1 to 78-6 may be switched alternately by a signal input to a control electrode pad of the semiconductor chip 78. In this example, each semiconductor chip 78 may generate heat at the time of switching. The input terminals P1, P2 and P3 may be connected to the cathode of an external power source, the input terminals N1, N2 and N3 may be connected to the anode of the external power source, and the output terminals U, V, and W may be connected to the load. The input terminals P1, P2 and P3 may be electrically connected to each other, and, in addition, the other input terminals N1, N2 and N3 may also be electrically connected to each other.

In the semiconductor module 100, the plurality of semiconductor chips 78-1 to 78-6 may each be an RC-IGBT (Reverse-Conducting IGBT) semiconductor chip. In the RC-IGBT semiconductor chips, IGBTs and free-wheeling diodes (FWDs) may be formed integrally, and additionally the IGBTs and FWDs may be connected in anti-parallel. The plurality of semiconductor chips 78-1 to 78-6 may each include a combination of a transistor such as a MOSFET or an IGBT and a diode. A chip substrate of the transistor and the diode may be a silicon substrate, a silicon carbide substrate or a gallium nitride substrate.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor module comprising:
a semiconductor device including a semiconductor chip; and
a cooling apparatus including a top plate on which the semiconductor device is placed, wherein
the cooling apparatus includes
a plurality of rows of metal plates being in contact with a lower surface of the top plate and arranged in a first direction and
the plurality of rows of metal plates includes
a first row of metal plates forming first openings with a first pitch in a second direction perpendicular to the first direction, the first openings allowing passage of a refrigerant otherwise blocked by the first row of metal plates; and
a second row including at least one metal plate forming second openings with a second pitch in the second direction at positions different from positions of the first openings, the second openings allowing passage of the refrigerant otherwise blocked by the second row of metal plates, wherein
all openings in the first row of metal plates including the first openings formed in the first row of metal plates have equal opening areas.

2. The semiconductor module according to claim 1, wherein
the second pitch is equal to or smaller than the first pitch.

3. The semiconductor module according to claim 2, wherein
all of the second openings formed in the second row of the at least one metal plate are equal.

4. The semiconductor module according to claim 3, wherein
opening areas of the all openings formed in the first row of metal plates are equal to opening areas of all openings formed in the second row of the at least one metal plate.

5. The semiconductor module according to claim 2, wherein
the first pitch and the second pitch are equal.

6. The semiconductor module according to claim 1, wherein
the first openings and the second openings are formed in a mesh pattern.

7. The semiconductor module according to claim 6, wherein
the first row of metal plates and the second row of metal plates are formed by metal wires being placed to cross each other.

8. The semiconductor module according to claim 1, wherein
the cooling apparatus includes:
a refrigerant inlet port provided at one side in the first direction; and
a refrigerant outlet port provided at another side in the first direction.

9. The semiconductor module according to claim 1, wherein
the semiconductor device includes
a circuit substrate to which the semiconductor chip is fixed; and
an internal space that houses the circuit substrate.

10. The semiconductor module according to claim 1, wherein
the top plate includes a through hole into which a screw is inserted.

11. The semiconductor module according to claim 1, wherein
the cooling apparatus includes a plurality of fins that are connected to a lower surface of the top plate.

12. The semiconductor module according to claim 11, wherein
the plurality of fins form refrigerant flow passages with a third pitch in the second direction.

13. The semiconductor module according to claim 12, wherein
the first pitch of the first openings or the second pitch of the second openings are equal to or smaller than the third pitch of the refrigerant flow passages.

14. The semiconductor module according to claim 12, wherein
the plurality of fins face at least one of the first row of metal plates in the first direction, and
at least one of the first openings is arranged for the refrigerant flow passages.

15. The semiconductor module according to claim 11, wherein
the cooling apparatus includes a fourth region formed between the first region and the second region in the first direction, and the first region and the second region are isolated by the fourth region.

16. The semiconductor module according to claim 15, wherein
a length between the first row of metal plates and the second row including the at least one metal plate is smaller than a length of the fourth region.

17. The semiconductor module according to claim 11, wherein
the semiconductor chip is provided between the plurality of rows of metal plates when seen from above.

18. The semiconductor module according to claim 11, wherein
the semiconductor chip is provided above the first region.

19. A semiconductor module comprising:
a semiconductor device including a semiconductor chip; and
a cooling apparatus on which the semiconductor device is placed, wherein
the cooling apparatus includes
a refrigerant delivery portion where a refrigerant is delivered;
a refrigerant inlet port provided at one side in a first direction in the refrigerant delivery portion;
a refrigerant outlet port provided at another side in the first direction in the refrigerant delivery portion; and a plurality of rows of metal plates that are provided on the one side of the refrigerant inlet port or the another side of the refrigerant outlet port and are arranged in the first direction, in the refrigerant delivery portion, and the plurality of rows of metal plates includes:

a first row of metal plates forming first openings with a first pitch in a second direction perpendicular to the first direction; and a second row including at least one metal plate forming second openings with a second pitch in the second direction at positions different from positions of the first openings, wherein all openings in the first row of metal plates including the first openings formed in the first row of metal plates have equal opening areas.

20. A semiconductor module comprising:

a semiconductor device including a semiconductor chip; and a cooling apparatus including a top plate on which the semiconductor device is placed, wherein the cooling apparatus includes a first row including at least one metal plate being in contact with a lower surface of the top plate;

a plurality of cooling fins being in contact with the lower surface of the top plate; and a second row including at least one metal plate being in contact with the lower surface of the top plate, wherein the first row including at least one metal plate, the plurality of cooling fins and the second row including the at least one metal plate are arranged in this order in a first direction, the first row including at least one metal plate is arranged in a second direction perpendicular to the first direction such that a plurality of first openings are formed with a first pitch, and each of the cooling fins is arranged in the second direction such that a plurality of second openings are formed with a second pitch, the second pitch being longer than the first pitch, wherein all openings in the first row including at least one metal plate including the first openings formed in the first row of metal plates have equal opening areas.

21. The semiconductor module according to claim 20, wherein a first arrangement region of the first row including at least one metal plate and a third arrangement region of the second row including the at least one metal plate are smaller than a second arrangement region of the plurality of cooling fins, in the first direction.

22. The semiconductor module according to claim 21, wherein the second arrangement region overlaps with the semiconductor chip to each other, and the first arrangement region and third arrangement region do not overlap with the semiconductor chip to each other, when seen from above.

23. The semiconductor module according to claim 22, wherein a first width of each of the first row including the at least one metal plate and a third width of each of the second row including the at least one metal plate are smaller than a second width of each of the plurality of cooling fins, in the second direction, each of the plurality of first openings are smaller than each of the plurality of second openings, in the second direction, and a first arrangement pitch of each of the first row including the at least one metal plate and a third arrangement pitch of each of the second row including the at least one metal plate are smaller than a second arrangement pitch of each of the plurality of cooling fins, in the second direction.

24. The semiconductor module according to claim 23, wherein a fourth region is provided between the first arrangement region and the second arrangement region, and the first row including the at least one metal plate, the second row including the at least one metal plate and the plurality of fins are not arranged in the fourth region, a fifth region is provided between the second arrangement region and the third arrangement region, wherein the first row including the at least one metal plate, the second row including the at least one metal plate and the plurality of fins are not arranged in the fifth region, and in the first direction, the fourth region is larger than the first arrangement region, the second arrangement region is larger than the fourth region, the fifth region is smaller than the second arrangement region, and the third arrangement region is smaller than the fifth region.

25. The semiconductor module according to claim 24, wherein the first width and the third width are equal, and the first arrangement pitch and the third arrangement pitch are equal.

* * * * *